(12) United States Patent
Oliver et al.

(10) Patent No.: US 6,342,753 B1
(45) Date of Patent: Jan. 29, 2002

(54) PIEZOELECTRIC TRANSFORMER AND OPERATING METHOD

(75) Inventors: John Oliver; Vivek Mehrotra, both of Newbury Park; R. R. Neurgaonkar, Thousand Oaks, all of CA (US)

(73) Assignee: Rockwell Technologies, LLC, Thousand Oaks, CA (US)

( * ) Notice: Subject to any disclaimer, the term of this patent is extended or adjusted under 35 U.S.C. 154(b) by 0 days.

(21) Appl. No.: 09/669,241

(22) Filed: Sep. 25, 2000

(51) Int. Cl.⁷ .............................................. H01L 41/08
(52) U.S. Cl. ........................................ 310/359; 310/366
(58) Field of Search ................................ 310/358, 359, 310/366

(56) References Cited

U.S. PATENT DOCUMENTS

| | | | | |
|---|---|---|---|---|
| 3,622,813 A | * | 11/1971 | Kumon .......................... 310/345 |
| 3,764,848 A | | 10/1973 | Berlincourt .................... 315/55 |
| 5,229,680 A | | 7/1993 | Sato et al. ..................... 310/339 |
| 5,241,236 A | | 8/1993 | Sasaki et al. .................. 310/358 |
| 5,424,602 A | | 6/1995 | Sato et al. ..................... 310/359 |
| 5,440,195 A | | 8/1995 | Ohnishi et al. ................ 310/359 |
| 5,463,266 A | * | 10/1995 | Fukuoka et al. .............. 310/359 |
| 5,504,384 A | | 4/1996 | Lee et al. ....................... 310/359 |
| 5,576,590 A | | 11/1996 | Ohnishi et al. ................ 310/359 |
| 5,595,677 A | | 1/1997 | Neurganonkar et al. ... 252/62.9 |
| 5,701,049 A | | 12/1997 | Kanayama et al. ............ 310/359 |
| 5,757,106 A | * | 5/1998 | Sato et al. ..................... 310/359 |
| 5,763,983 A | | 6/1998 | Huang .......................... 310/360 |
| 5,806,159 A | | 9/1998 | Ohnishi et al. ................ 29/25.35 |
| 5,818,150 A | * | 10/1998 | Yamamoto et al. ........... 310/359 |
| 5,841,216 A | | 11/1998 | Fransen et al. ............... 310/328 |
| 5,872,419 A | * | 2/1999 | Hah et al. ..................... 310/359 |
| 5,877,581 A | | 3/1999 | Inoi et al. ..................... 310/358 |
| 5,894,185 A | | 4/1999 | Asada et al. .................. 310/368 |
| 5,903,086 A | | 5/1999 | Ogiso et al. ................... 310/359 |
| 5,929,554 A | | 7/1999 | Kanayama et al. ........... 310/359 |
| 5,939,818 A | * | 8/1999 | Hakmata ...................... 310/359 |
| 5,969,462 A | * | 10/1999 | Huang et al. ................. 310/366 X |
| 5,969,954 A | * | 10/1999 | Zaitsu ........................... 310/359 X |
| 5,998,909 A | | 12/1999 | Kumasaka et al. ............ 310/348 |
| 6,012,207 A | | 1/2000 | Ogiso et al. ................... 29/25.35 |
| 6,060,819 A | * | 5/2000 | Tagami et al. ................ 310/366 |
| 6,078,127 A | * | 6/2000 | Saito et al. .................... 310/366 X |

OTHER PUBLICATIONS

Encyclopedia of Electronics and Computers, Pigeons and Doves (Ave. Columbiformes), Piezoelectric Effect, 1984, p. 2221, McGraw Hill Book Company.
Emcyclopedia of Electronics and Computers, Piezoelectric Crystal, 1984 pp. 625–631, McGraw Hill Book Company.
Piezoelectric Ceramics, Bernard Jaffe and William R. Cook, et al. 1971, Academic Press, pp. 30–31.
Piezoelectric Ceramics, Bernard Jaffe, William R. Cook and Hans Jaffe, 1971 Academic Press, pp. 16–17.

* cited by examiner

Primary Examiner—Mark Budd
(74) Attorney, Agent, or Firm—Koppel & Jacobs

(57) ABSTRACT

A piezoelectric transformer has pairs of input/output electrodes located on a piezoelectric body corresponding to period locations on a standing sine wave superimposed on said body, and having a waveform corresponding to vibrational modes of the piezoelectric body at resonance. The transformer also has a grounded guard electrodes to reduce parasitic coupling between its input and output regions.

25 Claims, 14 Drawing Sheets

PIEZOELECTRIC TRANSFORMER AND OPERATING METHOD

BACKGROUND OF THE INVENTION

1. Field of the Invention

The present invention relates generally to piezoelectric devices, and more particularly to a piezoelectric transformer supplied with an input a.c. current.

2. Description of the Related Art

Wound-type electromagnetic transformers have been used for generating high voltage in the internal power circuits of devices such as television deflectors or chargers for copiers which require high voltage. Such transformers consist of a conductor wound onto a magnetic core. Because a large number of turns are required to realize a high transformation ratio, transformers that are compact and slim in shape are extremely difficult to produce.

To remedy this problem, piezoelectric transformers utilizing the piezoelectric effect have been developed. FIG. 1 illustrates a Rosen-type piezoelectric transformer, according to Ohnishi, U.S. Pat. No. 5,806,159, A plate of a piezoelectric material 102 has upper and lower input electrodes 104 and 106 which define a driving or input region 108 of the piezoelectric plate 102. The remainder of the plate 102 constitutes a generator or output region 110 with an output electrode 112 at its end. The input region 108 is polarized orthogonal to the electrodes 104 and 106, as indicated by arrow 114 in the figure, while the output region 110 is polarized orthogonal to electrode 112, as indicated by arrow 116.

This piezoelectric transformer operates as follows: When a voltage is impressed across input electrodes 104 and 106 from external leads 118 and 120, an electric field increases in the direction of polarization, and a longitudinal vibration in the transverse direction parallel to electrodes 104 and 106 is excited by the piezoelectric effect, displaced in a direction perpendicular to polarization, known as the piezoelectric transverse 31 effect, causing the entire transformer to vibrate. Moreover, in the output region 110, due to the piezoelectric effect generating a potential difference in the polarization direction due to a mechanical strain in the polarization direction, a voltage is produced which has the same frequency as the input voltage from output electrode 112 to external lead 122. At this time, if the voltage input frequency is made equal to the resonant frequency of the piezoelectric transformer, a high output voltage can be obtained.

This piezoelectric transformer is used in a resonant state. Compared with ordinary electromagnetic transformers it has numerous advantages, including: 1) a compact and slim shape that can be achieved because a wound-type construction is not required and energy density is high; 2) the potential for non-combustibility; and 3) a lack of electromagnetic induction noise. Furthermore, the Rosen piezoelectric transformer is monolithic, which gives it an advantage over multi-layer devices in that it does not suffer from bonding problems such as a reduction in efficiency due to softening of the bonding layer at high temperatures.

In Rosen and other types of conventional piezoelectric transformers, a rectangular waveform input, (having a harmonic content of a series of sine waves according to the Fourier transform $f_o + 3f_o + 5f_o \ldots + nf_o$), produces an output having a sine waveform of only the fundamental frequency. This can be a disadvantage because the rise and fall time of a sine wave is much slower than that of a rectangular wave, and fast rise and fall times are important for driving transistor switches OFF and ON (such as in DC-DC power converters), since significant power losses occur in the transistors during the transition between the OFF and ON states.

Moreover, in Rosen and other conventional piezoelectric transformers the input and output regions are not entirely electrically separated, due to a parasitic capacitance between the input and output regions.

SUMMARY OF THE INVENTION

This invention provides a piezoelectric transformer and operating method capable of passing the fundamental and third harmonic frequencies of a rectangular wave input and with a reduced parasitic capacitance.

The new piezoelectric transformer has a monolithic planar structure in the form of a thin rectangular piezoelectric plate having a uniform polarity orthogonal to its major surfaces. Pairs of input and output electrodes are formed on the top and bottom surfaces of the piezoelectric plate. Since the device is monolithic, it does not suffer from bonding problems (e.g. bond elasticity) inherent with multi-layer devices. However, it is also possible to stack transformer layers if a higher output current is desired.

A three electrode pair embodiment enables the device to pass the fundamental and third harmonic frequencies of a rectangular wave input, producing a pseudo-rectangular wave output. A pseudo-rectangular wave has a much faster rise and fall time then a sine wave, although somewhat slower then a true rectangular wave.

A piezoelectric transformer according to the present invention is further capable of producing multiple isolated outputs of either polarity. It is well suited for driving both capacitive loads such as the input gate of a MOSFET power transistor, and other loads such as resistive or resistive/capacitive circuits.

Parasitic capacitance is minimized by grounding leakage current between the input and output regions. This is accomplished by placing a grounding element such as a grounded guard electrode between the input and output regions. In a monolithic transformer the grounding element can be a thin electrode disposed in a continuous band around the surface of the piezoelectric body, between the input and output regions. This can reduce the stray capacitance by a factor of 10 to 20, and the effective input-output coupling capacitance can be reduced to 1–5% of the input capacitance, depending upon the dielectric constant of the piezoelectric material.

Moreover, in comparison to electromagnetic transformers, the new piezoelectric transformer is compact, simple to fabricate, low cost, and immune to magnetic interference.

DETAILED DESCRIPTION OF THE INVENTION

Figure 2:
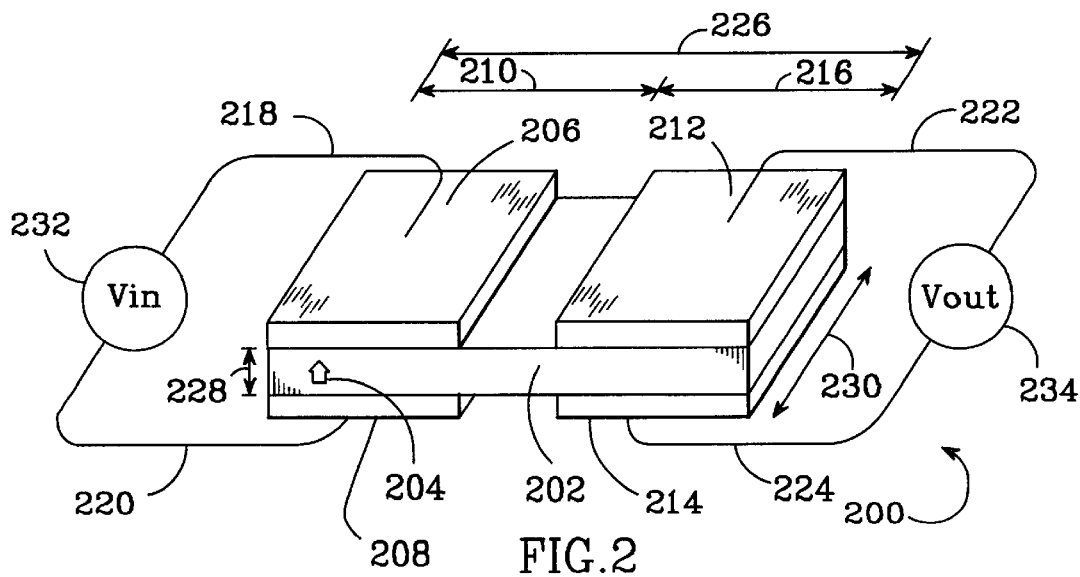
FIG. 2 is a perspective view of a basic piezoelectric transformer in accordance with the present invention.
Figure 3:
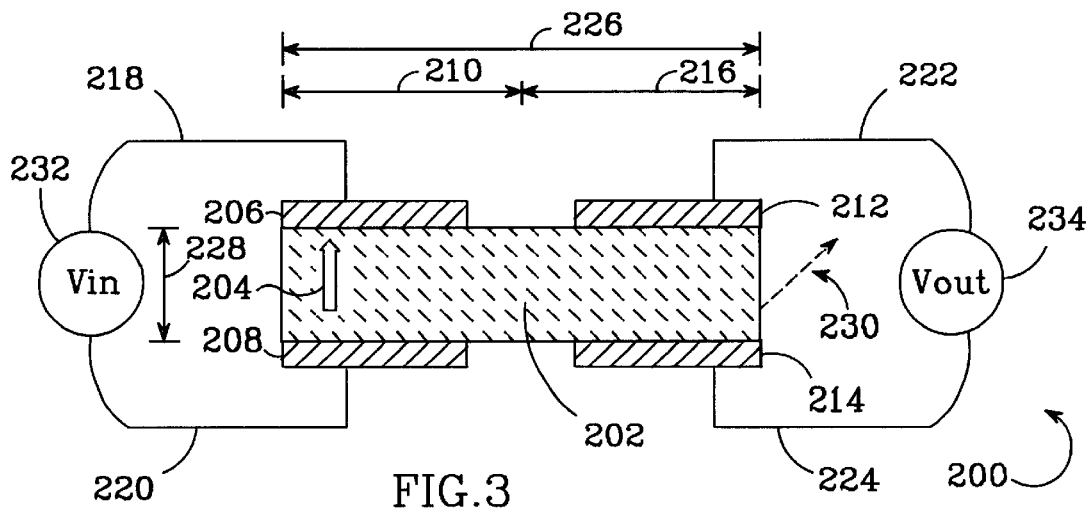
FIG. 3 is a sectional view of the piezoelectric transformer of FIG. 2.
Figure 4:
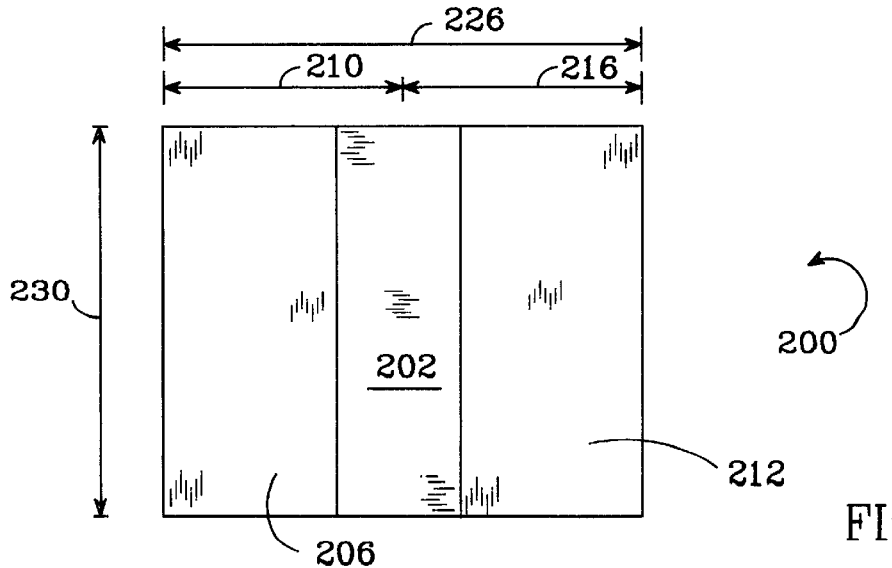
FIG. 4 is a top plan view of the piezoelectric transformer of FIG. 2.

FIGS. 2–4 illustrate a basic piezoelectric transformer 200 which is used here as a building block to illustrate various embodiments of the invention. It is noted that these and other figures illustrating various embodiments of a piezoelectric transformer are not to scale.

The piezoelectric transformer includes a body of piezoelectric material 202 which can be either a ceramic or a single crystal, and is in the form of a thin plate having a length 226, a thickness 228 (typically 1 mm or less), and a width 230. The polarization of the piezoelectric plate 202 is oriented in the thickness direction, as indicated by the arrow 204 in FIGS. 2 and 3. A pair of input electrodes 206 and 208, of equal areas, and a pair of output electrodes 212 and 214, also of equal areas, are disposed on the top and bottom major surfaces of the plate 202, using a technique such as sputtered deposition and photolithography. The input and output electrodes define input and output regions 210 and 216, respectively, with similar electrode geometries on the plate's top and bottom surfaces. External leads 218, 220, 222 and 224, are connected to the input and output electrodes 206, 208, 212, and 214, respectively.

The piezoelectric plate is poled to a uniform polarization direction by the application o f a high voltage(approximately 1000 to 3000 Volts for a 1 mm thick material), See B. Jaffe, W. R. Cook, and H. Jaffe, "Piezoelectric Ceramics," (Academic Press, N.Y., 1971) Pg. 16.

The application of a voltage 232 across the input region through the input electrodes 206, 208, creates a transverse internal stress in the device by means of the transverse electromechanical coupling constant, $k_{31}$. This stress attains a maximum value at the resonant frequency of the device, determined by its length 226 and the velocity of sound in the piezoelectric material (See Jaffe, Cook, Jaffe, Pg. 30, 31). Hence, for example, the internal stress at the fundamental resonance frequency consists of an acoustic standing wave with a wavelength equal to twice the length of the device. This internal stress is then converted back to an electrical charge at the output electrodes, via the transverse coupling constant, $k_{31}$, resulting in an output voltage 234 across the output electrodes 212, 214. (For an additional reference, see Encyclopedia of Electronics and Computers, S. Parker, McGraw-Hill 1984 p.625–630).

The open circuit voltage gain varies with the input/output electrode area ratio and the piezoelectric material constants according to:

$$|V_{out}|=\beta V_{in}k_{31}^2 Q/2$$

where $V_{out}$ and $V_{in}$ are the output and input voltages; $\beta$ is a proportionality constant which depends upon the electrode geometry and the ratio of the input/output electrode areas, Q is the material's quality factor at resonance, and $k_{31}$ is the transverse piezoelectric coupling constant for the material. Typically, $\beta$ has a value close to one for equal area contacts. Q values can reach up to 1000, and $k_{31} \leq 0.4$ for most piezoelectric materials. Since the open circuit device is loaded by an internal output capacitance, the addition of an external load capacitance reduces the load impedance by a proportional amount, and therefore reduces the voltage gain of the device. The addition of a capacitive load alters the resonant frequencies by a very small amount (typically 1–2%), but it does not significantly alter the device's Q.

Additionally, although the fundamental resonant frequency is determined by the length of the piezoelectric plate, its width can be any desired value. The width is typically greater then the length so as to minimize the output impedance of the device by maximizing the input and output electrode areas.

Figure 1:
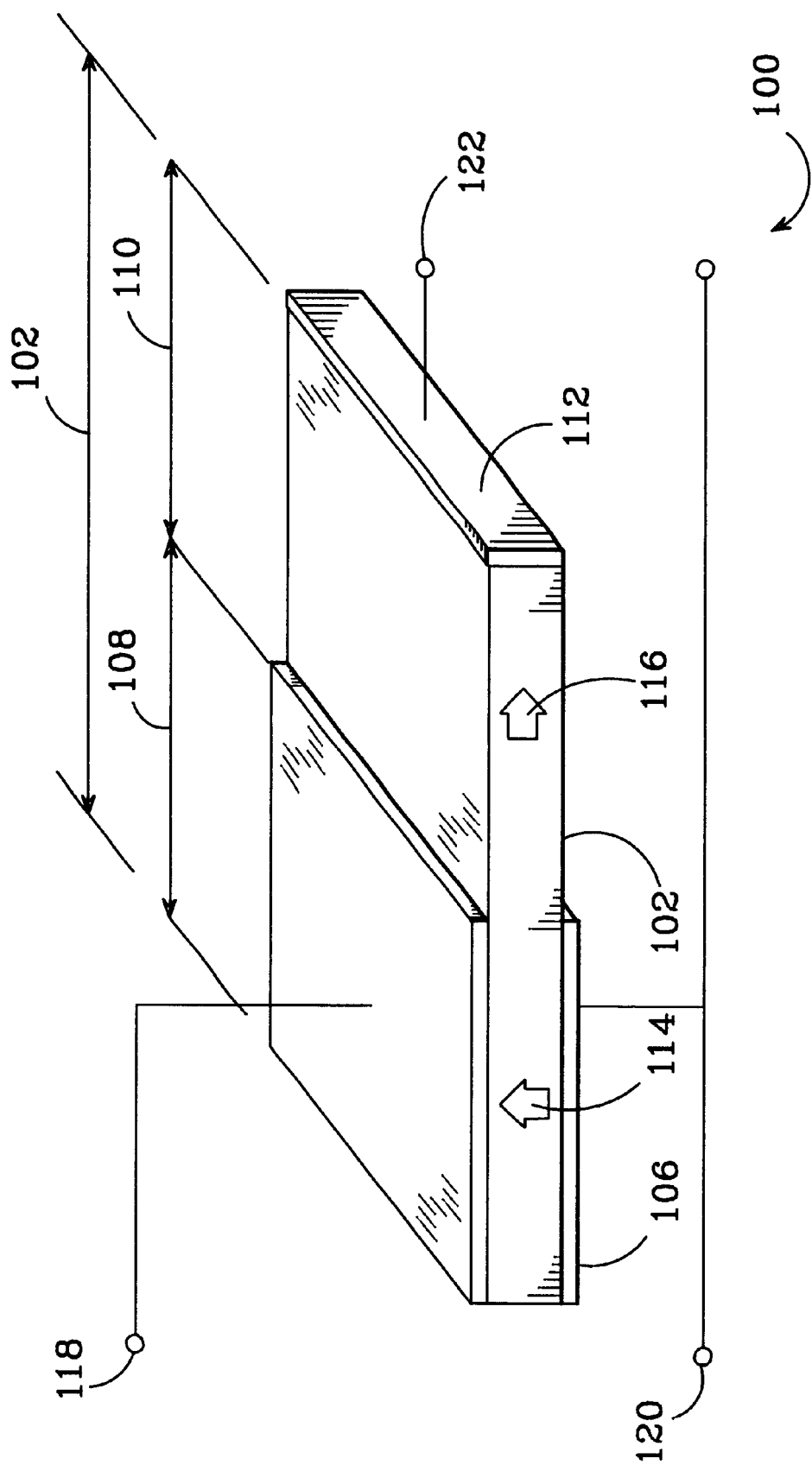
FIG. 1 is a perspective view of a prior Rosen-type piezoelectric transformer.

The basic piezoelectric transformer shown in FIGS. 2–4 and conventional piezoelectric transformers, such as the Rosen-type shown in FIG. 1, can pass only the fundamental frequency of a sine wave. However, harmonics of the fundamental frequency can be passed through the device by having multiple input and/or output regions forming a symmetry about the center of the piezoelectric plate. In theory, it is possible to have any number of input and output regions on a single piezoelectric plate. Each of these regions is defined by a pair of top and bottom electrodes, as in FIGS. 2–4.

Figure 5:
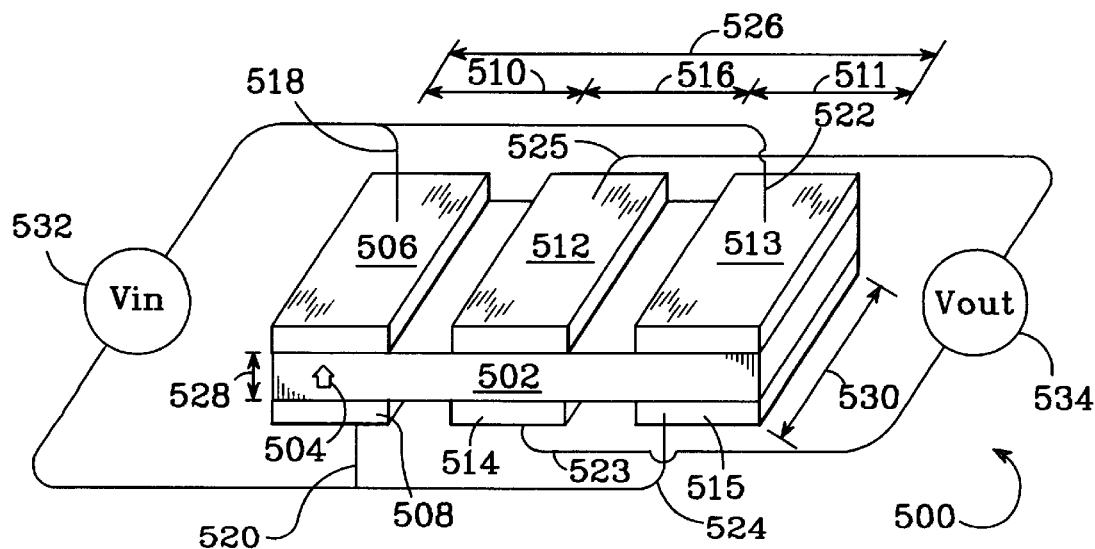
FIG. 5 is a perspective view of a piezoelectric transformer in accordance with the present invention, with a three electrode pair geometry.
Figure 6:
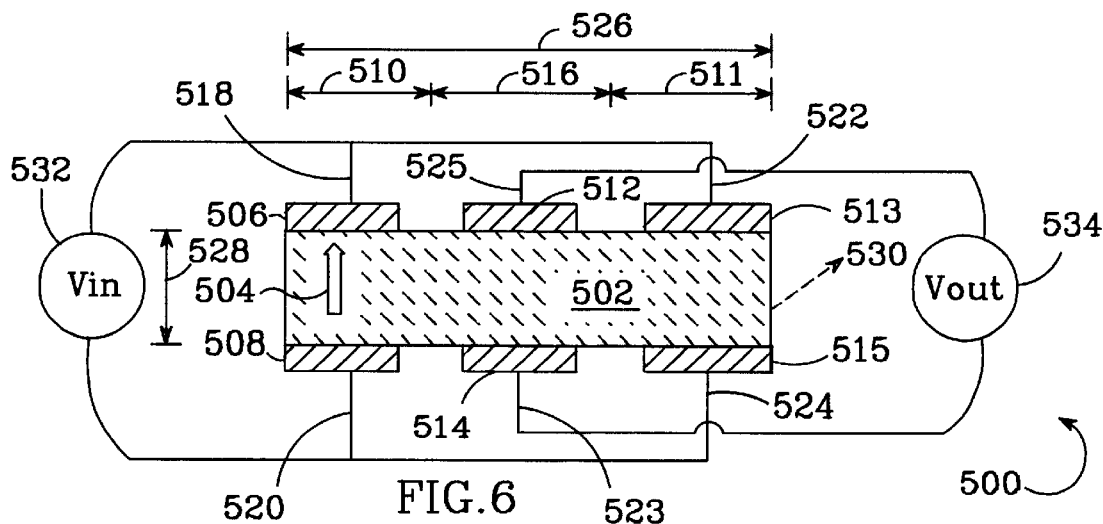
FIG. 6 is a sectional view of the piezoelectric transformer of FIG. 5.
Figure 7:
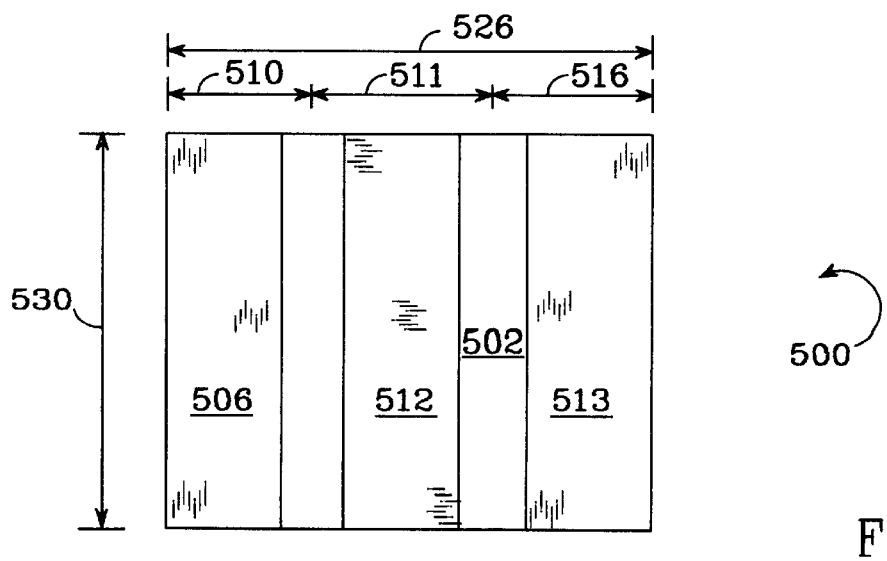
FIG. 7 is a top plan view of the piezoelectric transformer of FIG. 5.

FIGS. 5–7 illustrate a piezoelectric transformer 500 with a three-electrode pair geometry. This is similar to the piezoelectric transformer of FIGS. 2–4, except for the additional electrode pair. In FIGS. 5–7, a body of piezoelectric material 502, similar to body 202 in FIGS. 2–4 has a length 526, a thickness 528 (typically 1 mm or less), and a width 530. The polarization of the piezoelectric plate 502 is oriented in the thickness direction, as indicated by the arrow 504 in FIGS. 5 and 6. Two pairs of input electrodes 506, 508 and 513, 515, of approximately equal areas, are disposed on the top and bottom surfaces at opposite ends of the plate 502 and define input regions 510 and 511. A pair of output electrodes 512 and 514, of approximately equal areas, are disposed on the top and bottom surfaces of the plate 502 between the input regions 510 and 511, and define an output region 516. The electrode geometries on the plate's top and bottom surfaces are similar. External leads 518, 520, 522, 524, 523 and 525 are connected to the input and output electrodes 506, 508, 513, 515, 512, and 514, respectively. The input regions are driven by impressing a voltage 532, across the pair of input electrodes defining that region. The voltage across each of the regions has the same frequency, corresponding to the fundamental resonant frequency of the piezoelectric plate 502 to maximize the output, therefore a common voltage source for the two pairs of input electrodes 506, 508 and 513, 515 is preferable. This three electrode pair geometry enables the device to pass the fundamental frequency and the third harmonic of an input voltage 532 having a rectangular waveform to form an output voltage 534 having a pseudo-rectangular waveform.

Figure 26:
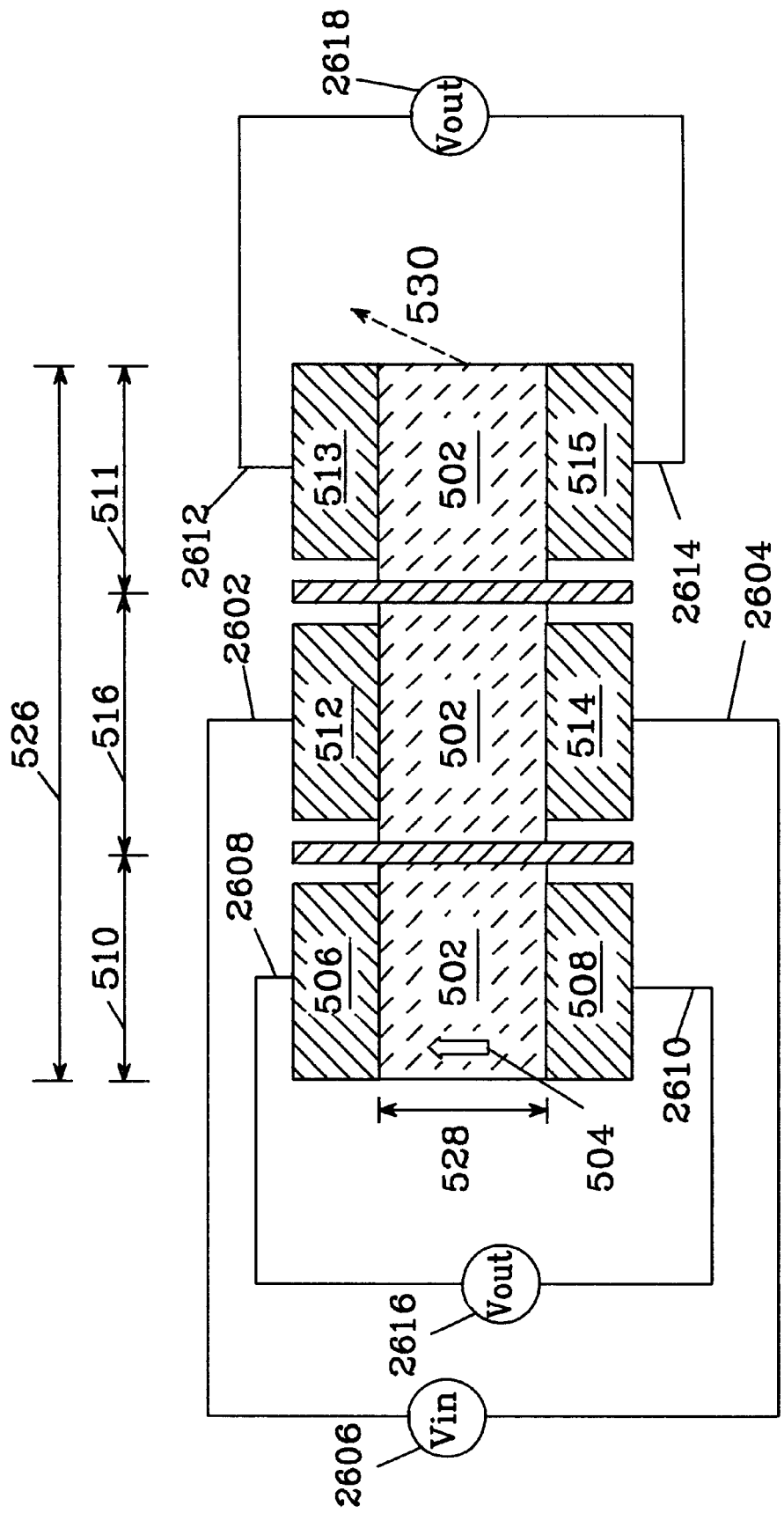
FIG. 26 is a sectional view of a piezoelectric transformer in accordance with the present invention, with a three electrode pair geometry, and with a center input region.

It is also possible to have the center region be the input, and the two outer regions be two individual outputs, and obtain a pseudo-rectangular output. This device is illustrated in FIG. 26, where 512 and 514 are the input electrodes defining the input region 516, and 506, 508, and 513, 515 are the two output electrode pairs defining output regions 510 and 511. External input leads 2602 and 2604 are connected to a voltage source 2606 for driving the device. Additionally, external output leads 2608, 2610, and 2612, 2614 yield two separate outputs 2616 and 2618, across each of the output regions 510, 511, respectively. These output regions can be connected together to enable a doubling of the available output current.

Figure 8:
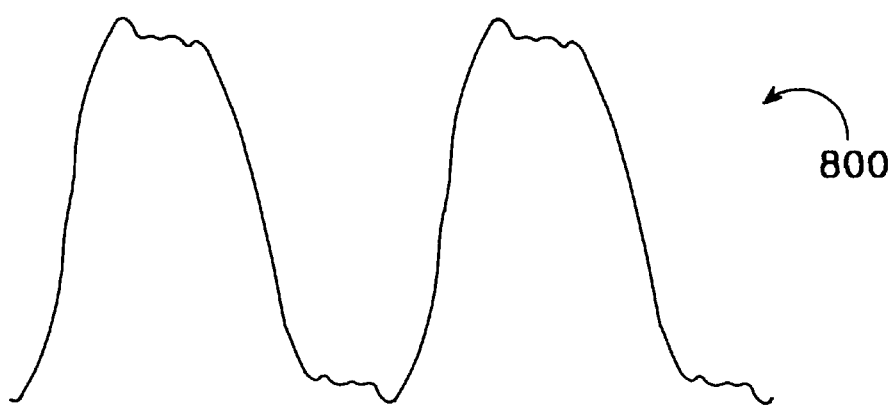
FIG. 8 is a plot of a pseudo-rectangular output waveform achievable with the invention, composed of the fundamental and third harmonic frequencies.
Figure 9:
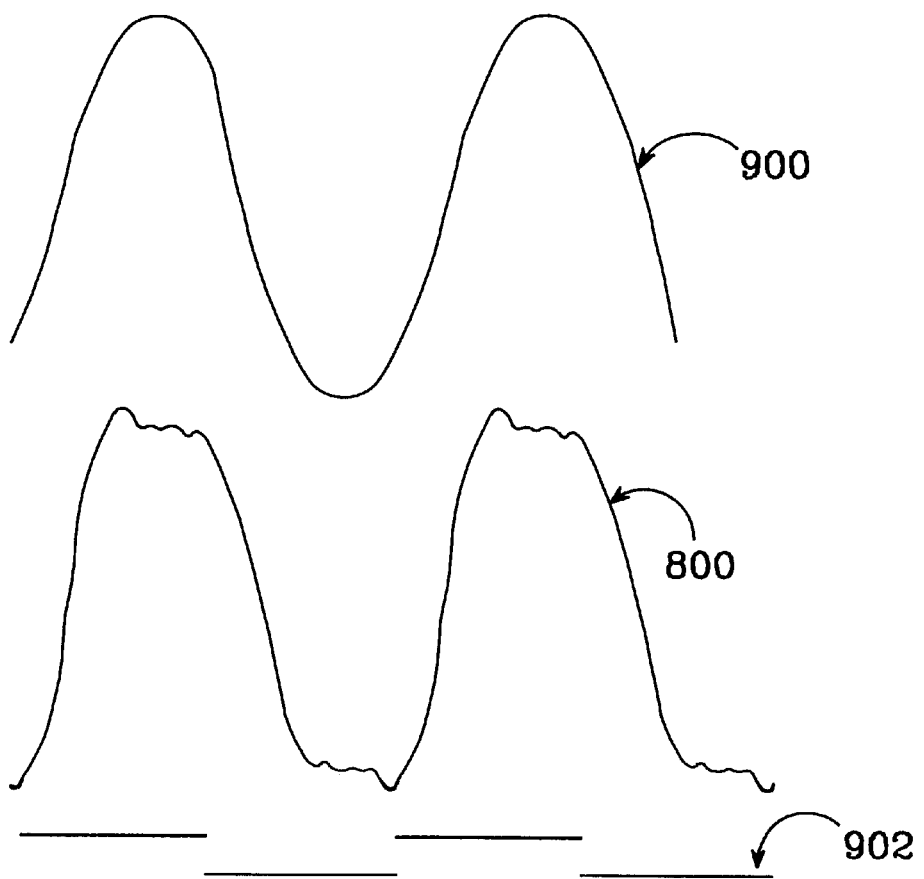
FIG. 9 is a plot comparing the pseudo-rectangular waveform of FIG. 8 to both a sine waveform and a pure rectangular waveform.

FIG. 8 is a plot of a pseudo-rectangular waveform output 800, composed of the fundamental and third harmonic frequencies, and FIG. 9 is a comparison of the pseudo-rectangular waveform with a corresponding sine waveform 900 and pure rectangular waveform 902. The pseudo-rectangular waveform produced has a much faster rise and fall time then a sine wave, although slower then the pure rectangular wave.

Thus, the new device which produces the pseudo-rectangular output can drive transistor switches off and on more rapidly and efficiently, since significant power losses occur in the transistors during the transitions between the off and on states. Additionally, the three-electrode pair device is ideally suited for driving a capacitive load, such as the input gate of a Metal-Oxide-Semiconductor Field Effect Transistor (MOSFET). The input capacitance of MOSFETs decreases dramatically, and then rises again, as they transition from an OFF to an ON output conducting state. The net result is that, when a MOSFET gate is driven by the piezoelectric transformer, the voltage transition in the pseudo-rectangular wave output of the transformer is accelerated due to the decreased load capacitance of the MOSFET in the transition region between OFF and ON. Besides MOSFET transistors, the three electrode pair device can also drive other loads such as resistive or resistive/capacitive loads.

Figure 10:
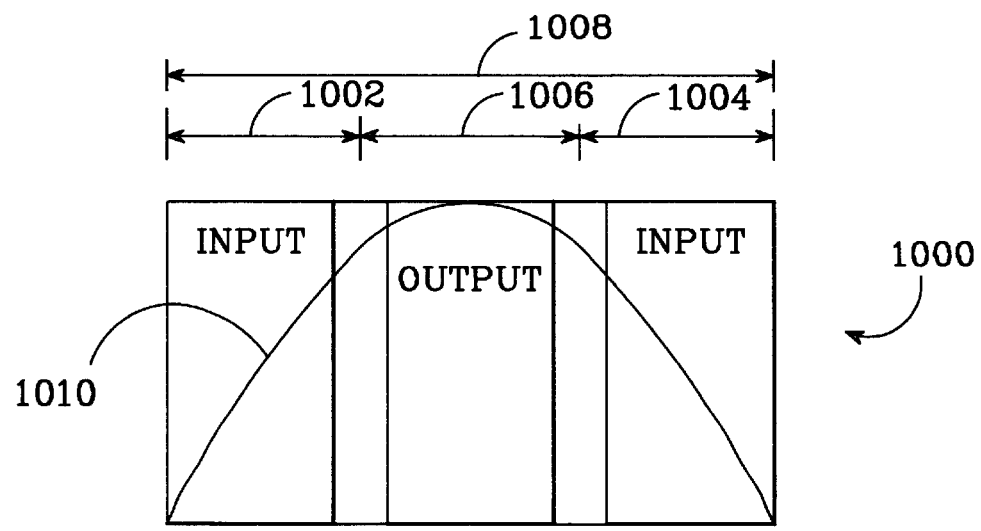
FIG. 10 is an illustration of a piezoelectric plate having three electrode pairs, with a superimposed sinusoidal standing wave.
Figure 11:
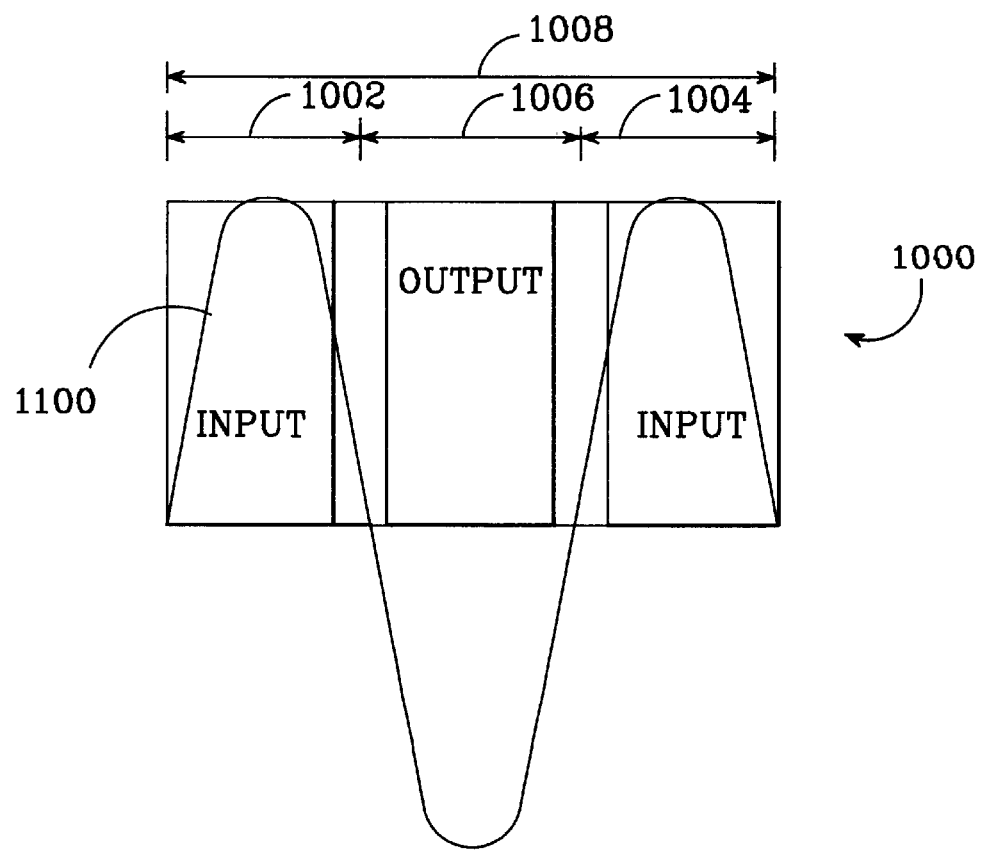
FIG. 11 is an illustration of the piezoelectric plate of FIG. 10, with a superimposed third harmonic sinusoidal standing wave.

The third harmonic and fundamental frequencies are passed with the three-electrode pair device because the output waveform is affected by the symmetry of the input regions over the piezoelectric body. FIGS. 10 illustrates a three electrode pair piezoelectric plate 1000 with input regions 1002, 1004, an output region 1006, and a standing sine wave of half a period 1010 that corresponds to the vibrational mode of the piezoelectric plate at its fundamental resonant frequency, superimposed along the plate's length 1008. FIG. 11 illustrates the same piezoelectric plate 1000 with a third harmonic sine wave of one-and-a-half periods, 1100 superimposed along its length. As can be seen from the figures, the symmetry of the input and output regions corresponds to the symmetry of the third harmonic and fundamental waves. Accordingly, it may be possible to produce other desired wave outputs by applying an input voltage to a piezoelectric body at symmetrical points corresponding to a superimposed waveform of the desired output.

Figure 12:
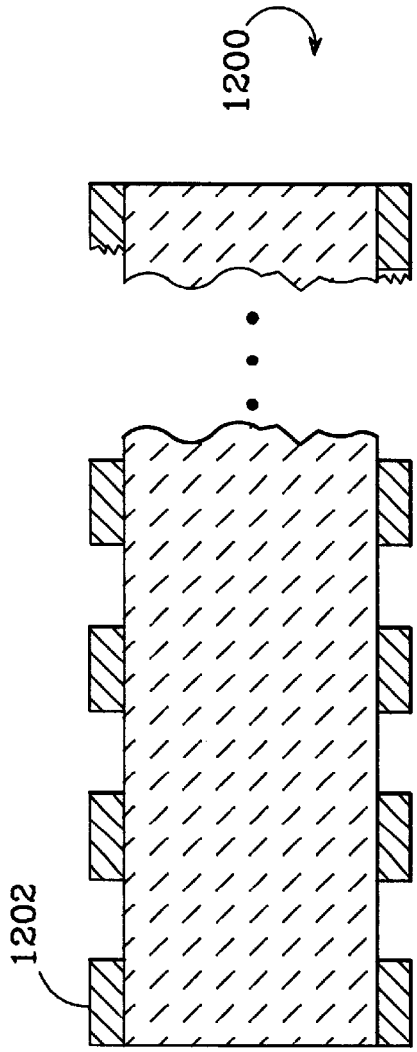
FIG. 12 is a sectional view of a piezoelectric transformer in accordance with the present invention, with n electrode pairs.

FIG. 12 illustrates a piezoelectric transformer 1200, similar to the piezoelectric transformer of FIGS. 5–7, but with n electrode pairs, where n is any number greater than 2. As in the three electrode pair embodiment, the input and output regions alternate. Additionally, the first electrode 1202 may define either an input or output region. Also, a voltage of the same frequency is applied to each of the input electrodes, and the outputs may either be combined or isolated.

Although in principle, the invention can be extended to any number of high order harmonics, experiments conducted with five electrode pairs on a ceramic PLZT piezoelectric (see U.S. Pat. No. 5,595,677) showed only faint but measurable fifth harmonics, and nearly undetectable fifth harmonics with a Strontium Barium Niobate (SBN) crystal piezoelectric.

Figure 13:
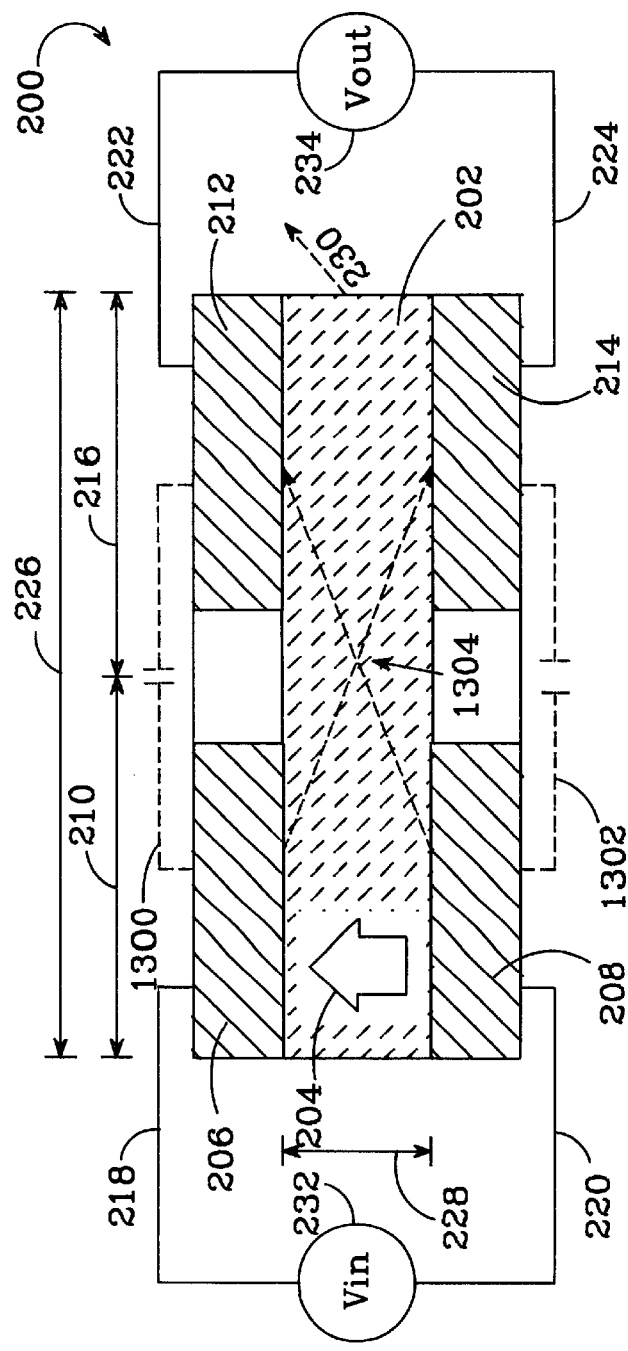
FIG. 13 is a sectional view of the piezoelectric transformer of FIG. 2, illustrating parasitic coupling.

Another feature of the new piezoelectric transformer is a reduction of the parasitic capacitive coupling between the input and output regions using a guard electrode. FIG. 13 illustrates the problem of parasitic coupling using the two electrode pair device 200 illustrated in FIGS. 2–4. Since the material used is a dielectric, there is capacitive coupling between the input and output regions 210 and 216, illustrated by the dashed lines representing capacitor circuit branches 1300 and 1302. This capacitive coupling causes current to leak between the input and output electrodes, as illustrated by the arrows 1304 in the figure, resulting in a lack of full electrical separation between the input and output.

Figure 14:
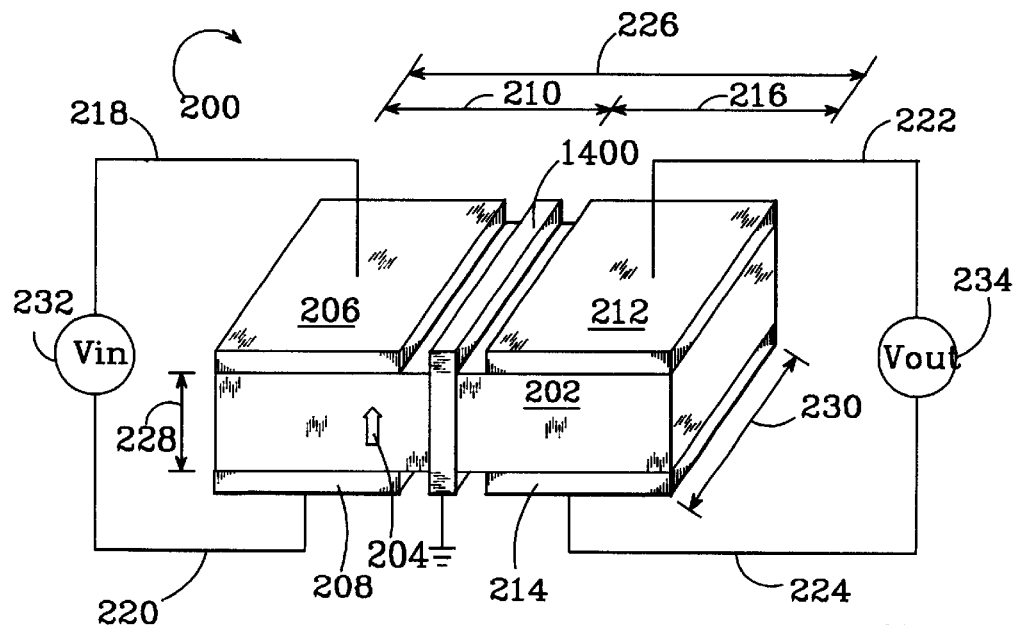
FIG. 14 is a perspective view of the piezoelectric transformer of FIG. 2, with a guard electrode added.
Figure 15:
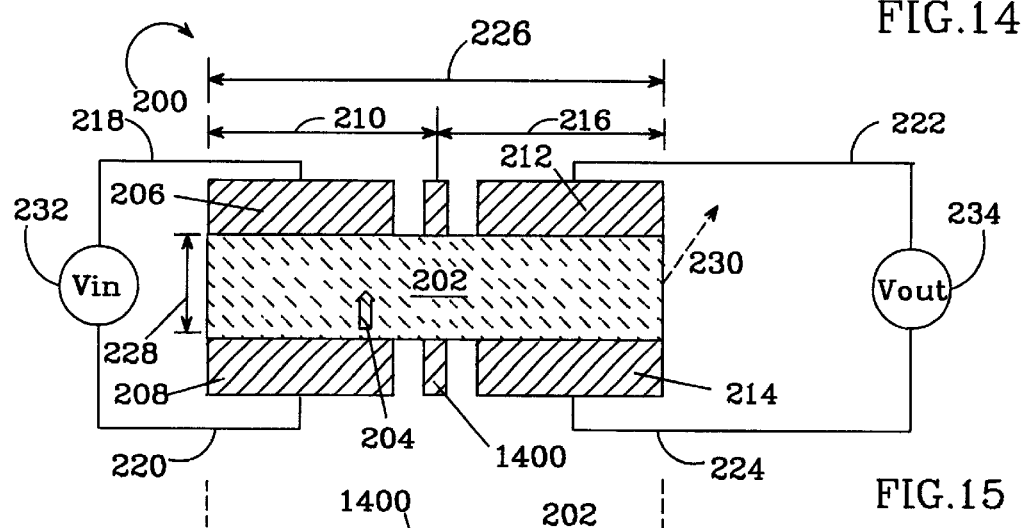
FIG. 15 is a sectional view of the piezoelectric transformer of FIG. 14.
Figure 16:
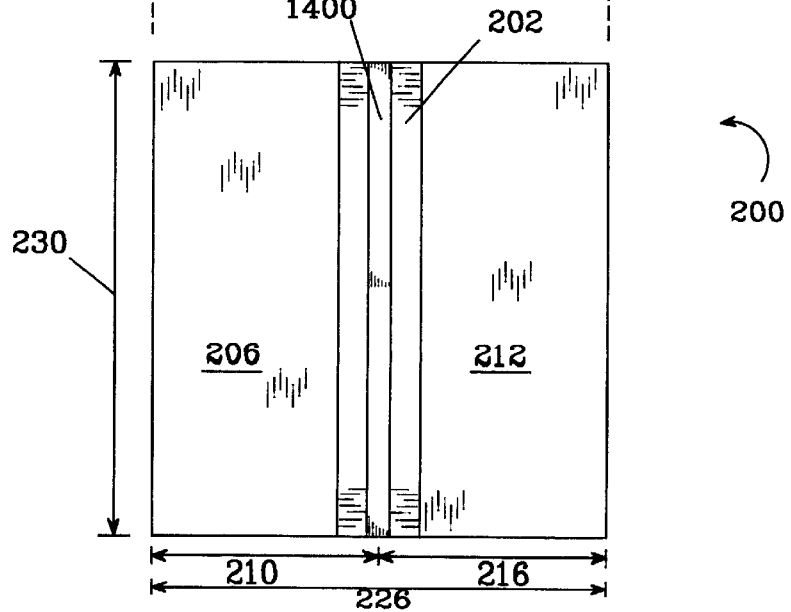
FIG. 16 is a top plan view of the piezoelectric transformer of FIG. 14.

To alleviate the parasitic coupling, the current leaking between the input and output regions 210 and 216 is grounded by a grounding element located between the two regions. This grounding element is preferably a grounded guard electrode located between the input and output regions. FIGS. 14–16 illustrate an example of the piezoelectric transformer of FIGS. 2–4, with such a grounding electrode 1400. The electrode 1400 can be of the same material as the input and output electrodes, and is disposed in a thin band preferably on the order of 1 mm or less in width around the surface of the piezoelectric plate. The band can be deposited in the same deposition process used for the input and output electrodes, creating a division between the input and output regions 210 and 216. The electrode 1400 is grounded by connecting to an electrical ground (0 Volts) circuit. This grounding electrode typically lowers the effect of stray capacitance by a factor of 10 to 20, and reduces the effective coupling capacitance to 1–5% of the input capacitance as determined by the dielectric constant of the material used.

Having a guard electrode can greatly simplify electronic designs, because the parasitic capacitance coupling paths between the MOSFET inputs do not have to be worried about. In the case of driving active devices such as MOSFET transistors, the guard electrode can minimize potentially undesired interactions between the MOSFET and the input source to the transformer. Similarly, it can reduce coupling interaction between MOSFETs which are driven by multiple piezoelectric transformer outputs.

Additionally, it has been found that the grounding electrode improves the transformer gain and quality factor "Q".

A piezoelectric transformer having any number of input/output regions can have a guard electrode between each of the regions. Thus for a piezoelectric transformer having n electrode pairs, there are n−1 guard electrodes.

Figure 17:
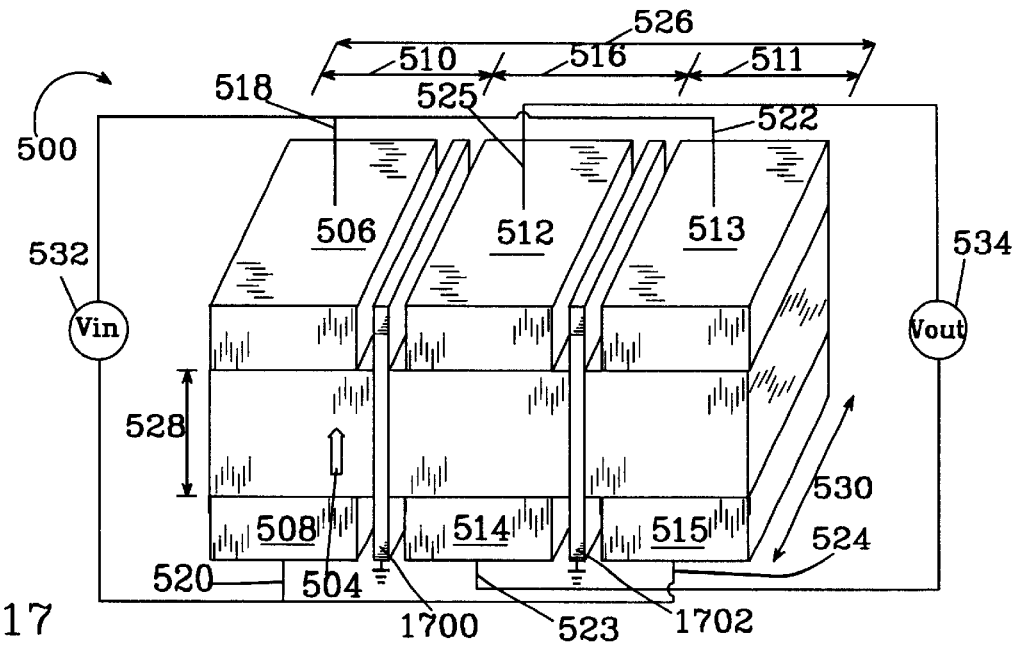
FIG. 17 is a perspective view of the piezoelectric transformer of FIG. 5, with guard electrodes added.
Figure 18:
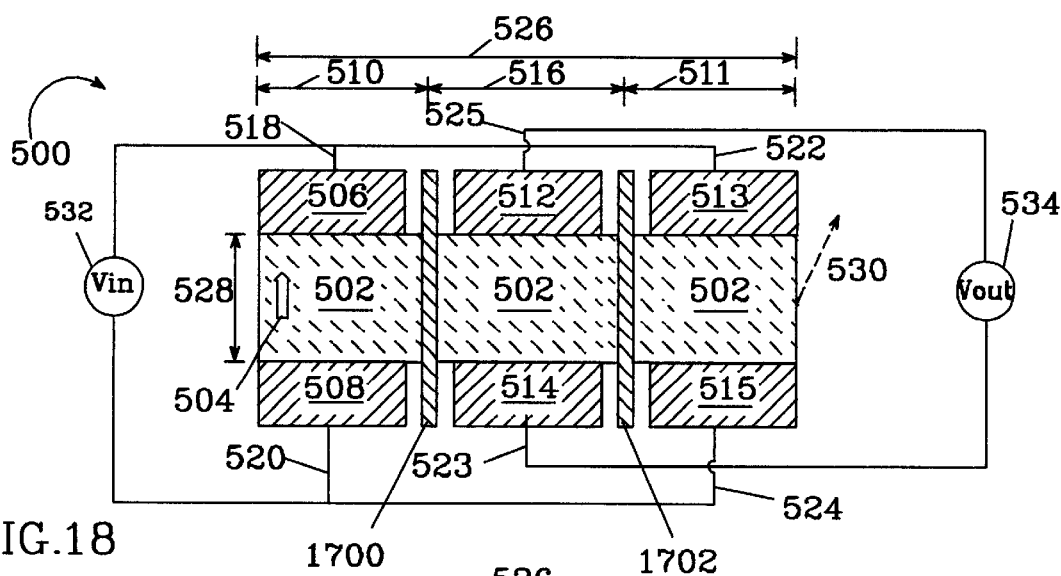
FIG. 18 is a sectional view of the piezoelectric transformer of FIG. 17.
Figure 19:
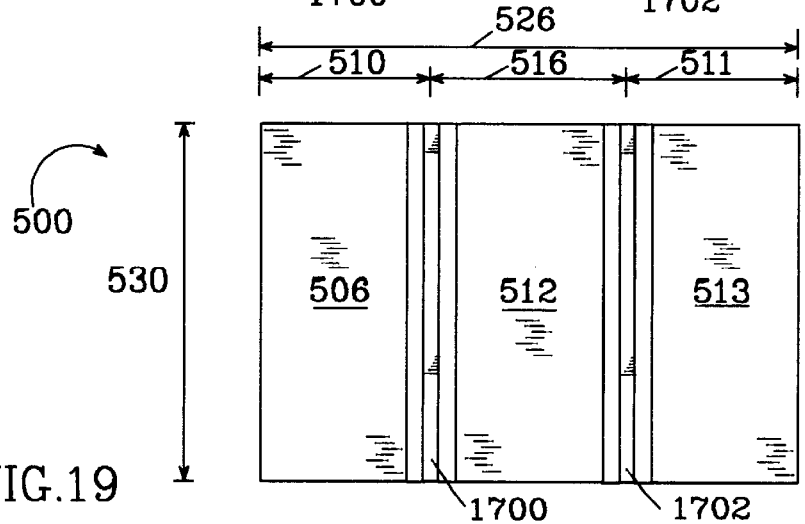
FIG. 19 is a top plan view of the piezoelectric transformer of FIG. 17.

FIGS. 17–19 illustrate the three electrode pair device of FIGS. 5–7, with grounded guard electrodes 1700 and 1702 disposed in thin bands around the piezoelectric plate, between the input regions 510 and 511 and the output region 516.

Figure 20:
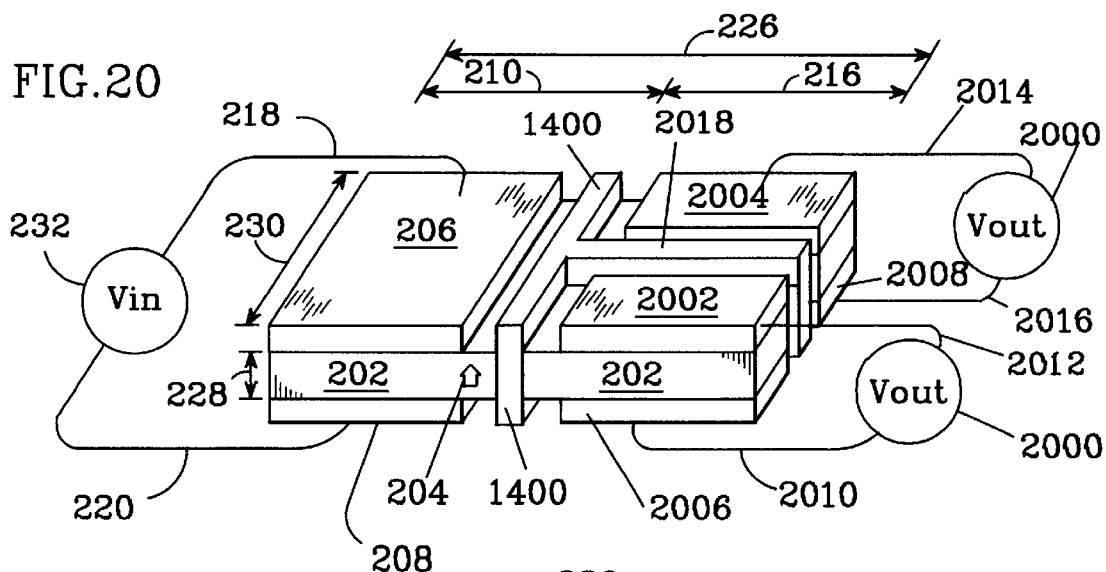
FIG. 20 is a perspective view of the piezoelectric transformer of FIG. 14, with multiple isolated outputs.
Figure 21:
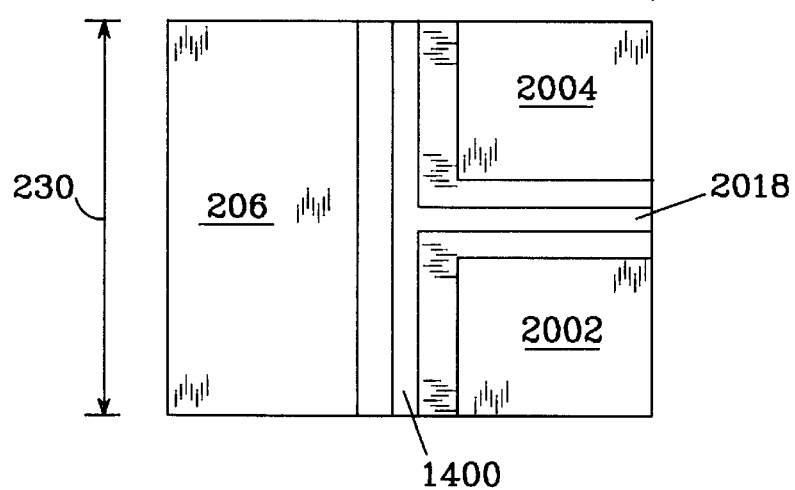
FIG. 21 is a top plan view of the piezoelectric transformer of FIG. 20.
Figure 22:
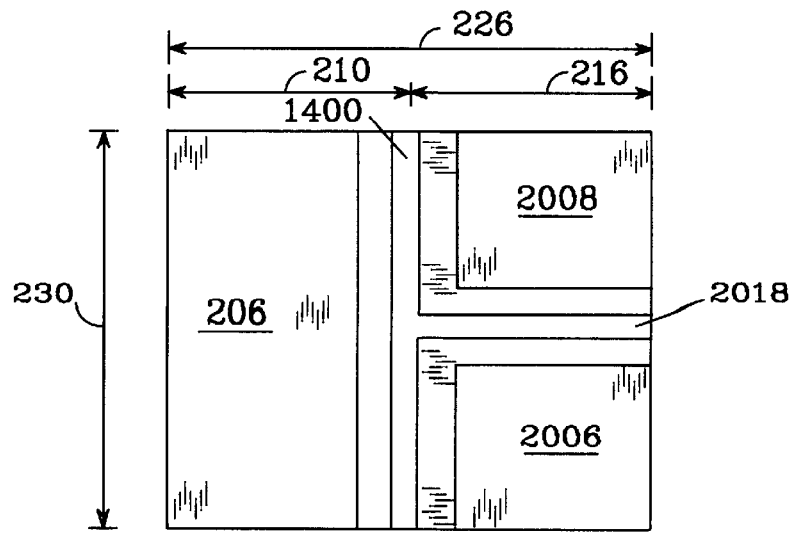
FIG. 22 is a bottom plan view of the piezoelectric transformer of FIG. 20.

It is also possible to divide a single output region into multiple output regions, defined by multiple electrode pairs in each output region and isolated from each other. This can be done with any number of input/output regions. FIGS. 20–22 illustrate the device of FIGS. 14–16, with two isolated outputs 2000, 2001 defined by two electrode pairs 2002, 2006 and 2004 and 2008, disposed on the top and bottom surfaces of output region 216, and connected to the outputs 2000, 2001 through external leads 2010, 2012 and 2014, 2016. A guard electrode 2018, extending from guard electrode 1400, is located between the isolated output regions. Since this device has one input and one output region 210, 216, as discussed above, a pseudo-rectangular output is not attainable with this device, and the outputs will have a sine waveform.

Figure 23:
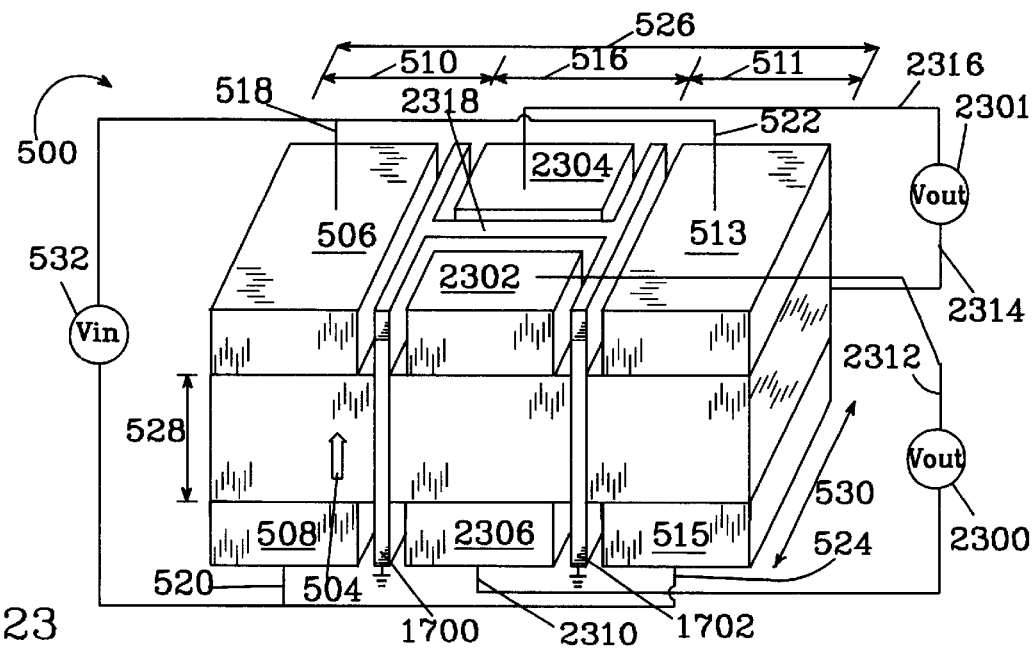
FIG. 23 is a perspective view of the piezoelectric transformer of FIG. 17, with multiple isolated outputs.
Figure 24:
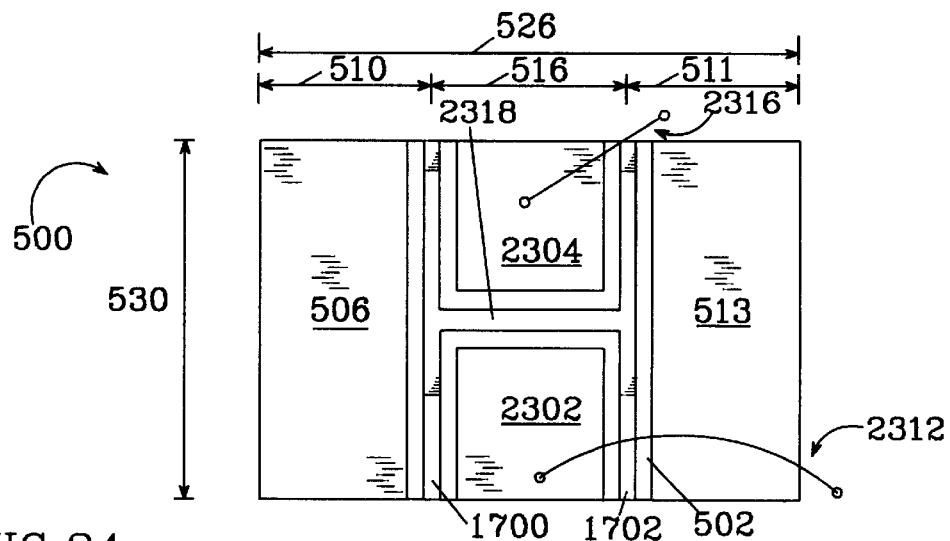
FIG. 24 is a top plan view of the piezoelectric transformer of FIG. 23.
Figure 25:
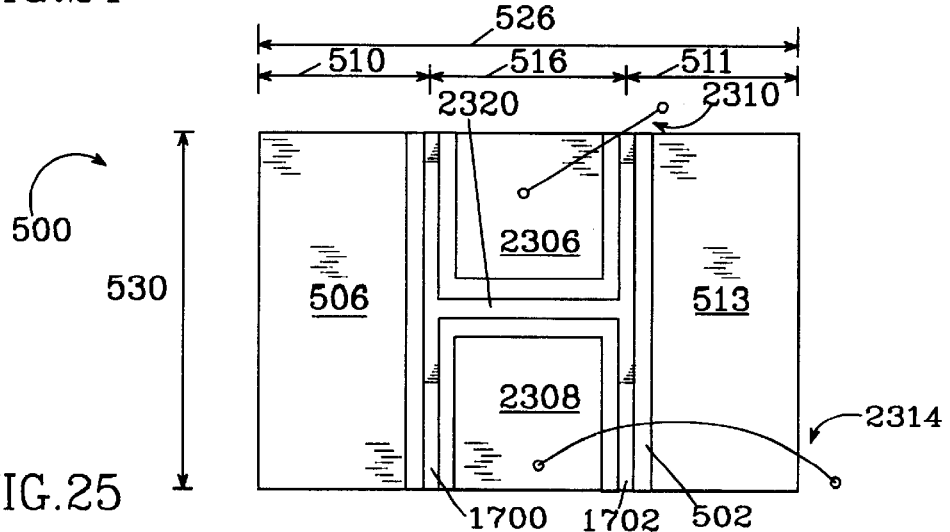
FIG. 25 is a bottom plan view of the piezoelectric transformer of FIG. 23.

FIGS. 23–25 illustrate the device in FIGS. 17–19, with two isolated outputs 2300, 2301 defined by two electrode pairs 2302, 2306 and 2304, 2308, disposed on the top and bottom surfaces of the output region 516, and connected to the outputs 2300, 2301 through external leads 2310, 2312 and 2314, 2316. Guard electrodes 2318, 2320 extending from guard electrodes 1700, 1702 are located between the isolated output regions. Since this device has two input and one output regions, each of the isolated outputs 2300, 2301 will have a pseudo-rectangular waveform.

Another multiple output configuration is illustrated in FIG. 26, where the center region is the input and the two outer regions are isolated outputs, as discussed above.

The output polarity is determined by the input polarity, phase shifted by 900 for a non loaded or capacitive loading condition. Such isolated outputs operate at the same frequency and can be connected to various parts of an electronic circuit. The outputs can be made to have opposite polarity by connecting them 180° out of phase from one another. This has a particular advantage for a two-output device, such as a DC-DC power converter, since the two outputs can be of opposite polarity. Such multiple isolated outputs are also useful for driving MOSFET switching transistors in an AC-to-DC or DC-DC conversion circuit. These devices are used in a bridge configuration, with one transistor off and the other on during each half of the AC input cycle. The piezoelectric transformer capable of multiple isolated outputs is well suited for this, since one output can be connected 180° out of phase from the other one, with both outputs operating at the exact same frequency. Additionally, a transformer capable of a pseudo-rectangular waveform output, and having the guard electrode, yields additional benefits as discussed above.

In theory, any number of isolated outputs can be obtained by further dividing each output region, as illustrated in FIGS. 20–25, and/or by increasing the number of input/output regions as illustrated in FIGS. 12 and 26. Many multiple output configurations are possible, although it is doubtful that more than two or three outputs would be of much interest. Although in FIGS. 20–25 the output regions are illustrated as being divided along the width, it may also be possible to divide the region along the length. Also, increasing the number of outputs decreases the individual output electrode areas, and hence the available current at each output, by a proportional amount. Other considerations for determining the specific set up include the desired voltage gain at the output, the given output load, the device dimensions, and voltage input.

Figure 27:
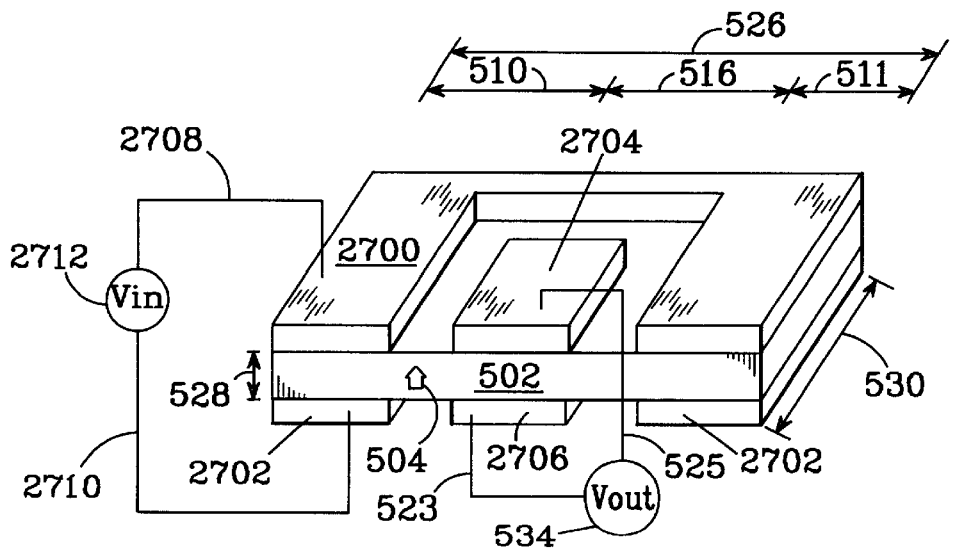
FIG. 27 is a perspective view of the piezoelectric transformer having three regions with a continuous electrode connecting the outer input regions.
Figure 28:
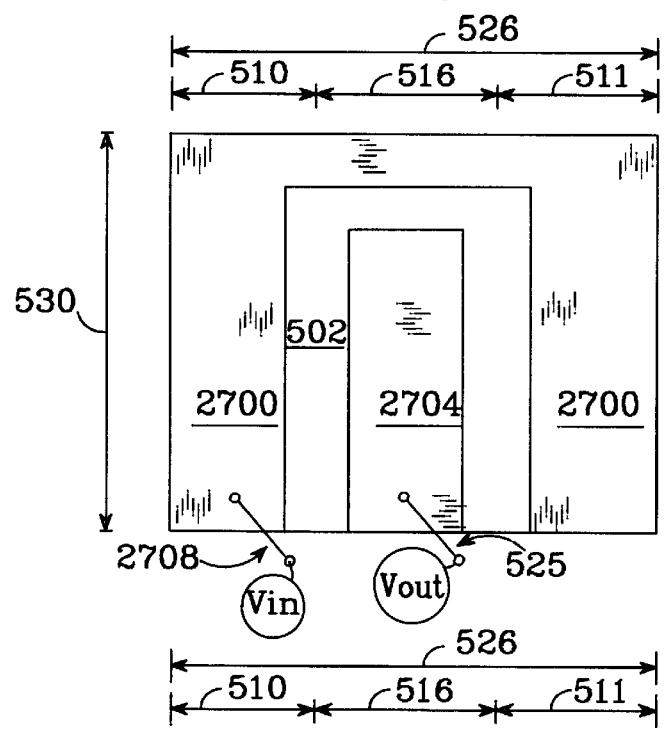
FIG. 28 is a top plan view of the piezoelectric transformer of FIG. 27.
Figure 29:
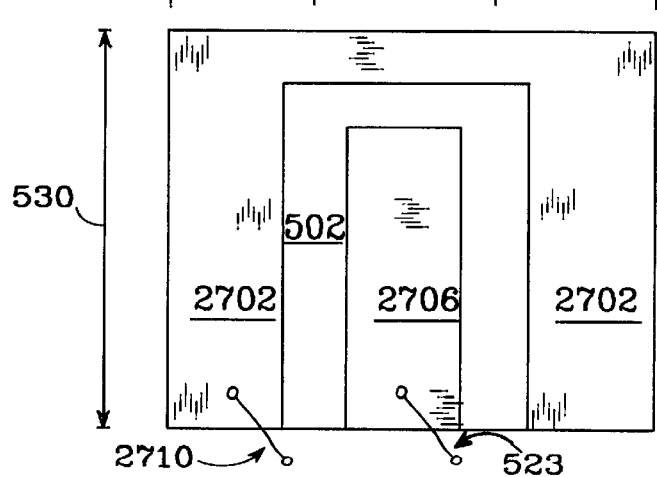
FIG. 29 is a bottom plan view of the piezoelectric transformer of FIG. 27.

Many variations in the electrode geometry are possible. FIGS. 27–29 illustrates one such variation, in which the two input regions 510 and 516 of FIGS. 5–7 are connected across the surface, forming continuous input electrodes 2700, 2702 and output electrodes 2704, 2706 on the top and bottom surfaces, which define the two input regions 510 and 511. Hence only two external leads 2708, 2710 are needed to connect to the input voltage 2712 for driving the input regions 510, 511.

Figure 30:
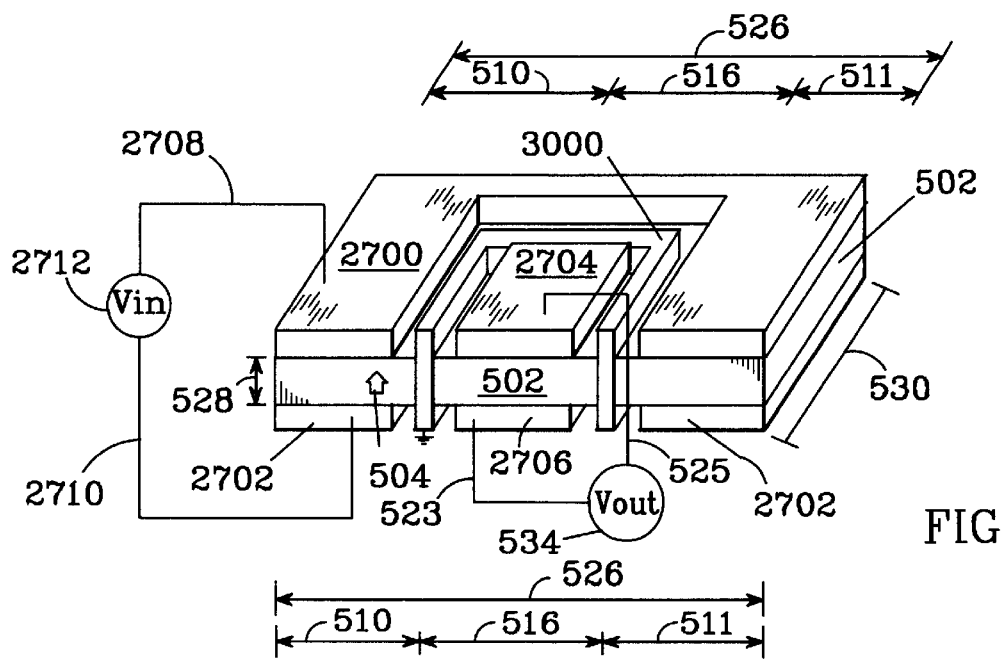
FIG. 30 is a perspective view of the piezoelectric transformer of FIG. 27 with a ground electrode added.
Figure 31:
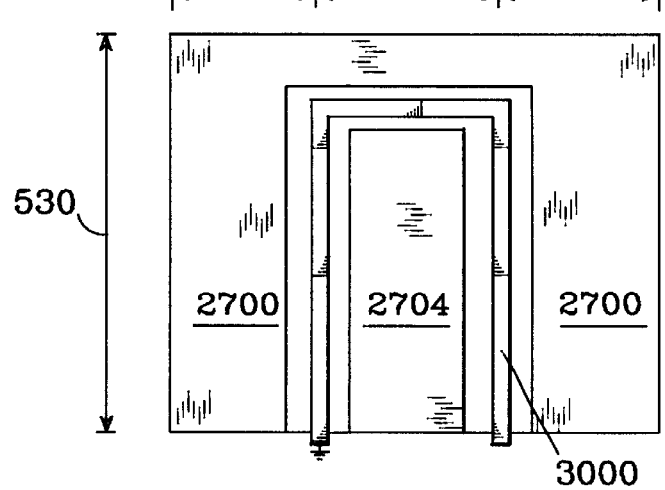
FIG. 31 is a top plan view of the piezoelectric transformer of FIG. 30.
Figure 32:
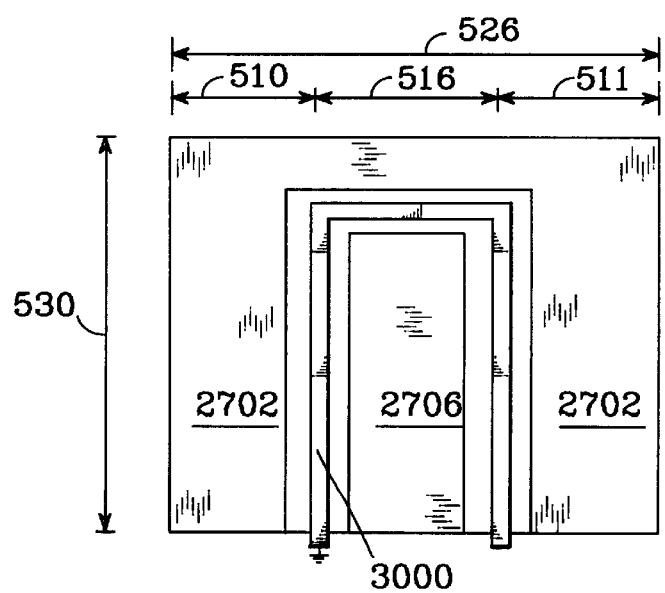
FIG. 32 is a bottom plan view of the piezoelectric transformer of FIG. 30.

FIGS. 30–32 illustrate the piezoelectric transformer of FIG. 27–29, with an added grounded guard electrode in the form of a "U" shaped thin electrode, located between the input and output electrodes. The guard electrode 3000 in this embodiment forms a loop that saddles around the output electrodes covering three sides of the plate, instead of forming a continues band around the piezoelectric plate.

One example of a working model for a three electrode pair device, according to FIGS. 27–29, is as follows:

| Material: | PLZT-9 (Rockwell U.S. Pat. No. 5,595,677) |
|---|---|
| Length: | 12 mm |
| Width: | 40 mm |
| Thickness: | 0.5 mm |
| Electrodes: | Gold (sputter deposited) |
| Resonant $f_0$: | 155.0 kHz* |
| Output voltage gain (no load): | 9.27 |
| Input resistance: | 18.9 ohms* (at resonant $f_0$) |
| Resonant Q: | 64.6 |
| Max output voltage: | 120 volts (peak-to-peak)* |

All electrical parameters depend upon the material used. Parameters marked with an asterisk are also determined by device dimensions Although a single layer rectangular device is the preferred embodiment, the invention also includes other configurations such as a circular device with concentric electrode rings. However, this limits the amount of output current available (which is proportional to the input and output electrode areas), since the device diameter scales inversely with the fundamental operating frequency, $f_0$. With a rectangular device, only the device length scales inversely with $f_0$, while the width can be many times greater than the length, thus increasing the amount of output current. Another advantage of a rectangular device is that it is very easy to cut with great precision using common semiconductor processing equipment. Hence, processing can be fast and inexpensive.

Figure 33:
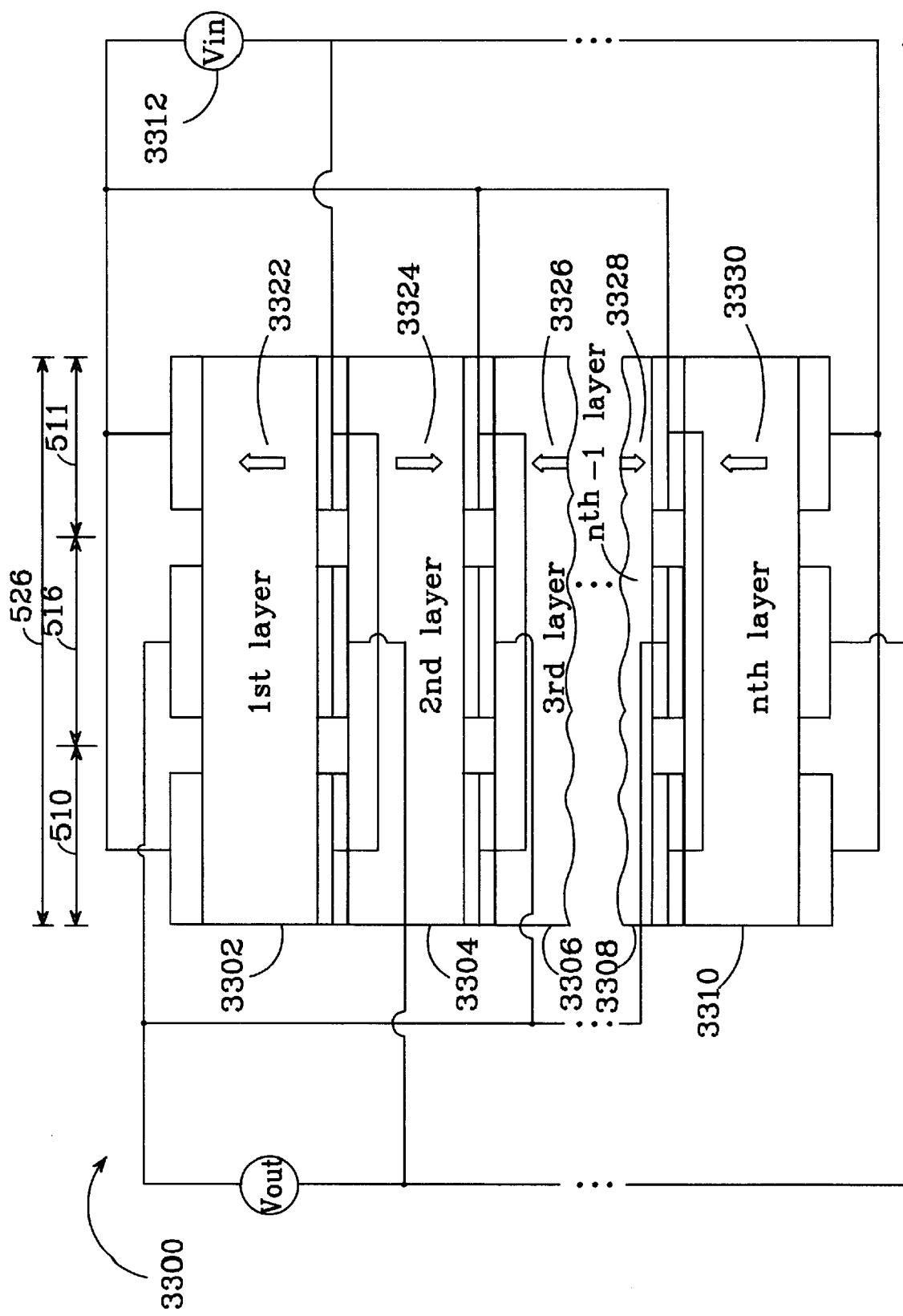
FIG. 33 is a sectional view of a multi-layer piezoelectric transformer, in accordance with the present invention.

The transformer can be implemented with multiple layers, preferably thin rectangular plates bonded together, instead of a long thin device, to increase the available output current. FIG. 33 shows such multi-layer device 3300. Although the figure illustrates the piezoelectric layers of the device in FIGS. 5–7, any of the other single layer devices according to this invention may be implemented in multiple layers. Any number of layers may be used, depending upon the desired output. An electrical connection is desired between the top and bottom electrodes of successive, adjacent layers, with the exception of the top electrode of the top layer and the bottom electrode of the bottom layer. This is illustrated in the figure where three bottom electrodes of the first piezoelectric layer 3302 are bonded to the three top electrodes of the second piezoelectric layer 3304, and the bottom three electrodes of the second layer 3304 are bonded to the three top electrodes of the third layer 3306, and so on, to the $n^{th}$ layer 3310, whose three top electrodes are bonded to the three bottom electrodes of the $n^{th}-1$ layer 3308. Additionally, the layers are aligned with their polarizations in alternating directions, as illustrated by the arrows, 3322, 3324, 3326, 3328, 3330, so that electrodes bonded to one another will have the same polarity.

The layers may be bonded together with a conducting epoxy layer, or a non conducting epoxy and then electrically connected by a conducting material. This can be done by bringing out electrodes to the edges of the piezoelectric layers, using very thin interconnection traces. The same metal used for the electrodes can be used for this.

The device is driven by applying a voltage 3312 to each of the input regions 510, 511 through the top input electrodes and bottom input electrodes of each layer. All of the inputs and outputs may be connected in parallel to each other. Additionally, the layers may have guard electrodes.

The multi-layer device would be the preferred embodiment for high frequency devices operating in the range of 1 MHz, in which the length is only 1–2 mm.

While specific examples of the invention have been shown and described, numerous variations and alternate embodiments will occur to those skilled in the art. Accordingly, it is intended that the invention be limited only in terms of the appended claims.

We claim:

1. A piezoelectric transformer comprising:
   a piezoelectric body having a length and first and second opposed, parallel major surfaces, said piezoelectric body being divided into three regions spaced apart along the length of the piezoelectric body, said regions comprising alternate input and output regions, said piezoelectric body being polarized in a direction normal to said major surfaces along the entire length of said piezoelectric body; and
   a first electrode and a second electrode covering the first and second major surfaces, respectively, of each of said three regions.

2. The piezoelectric transformer as defined in claim 1 which includes:
   an electrical guard element, in contact with the opposed, parallel major surfaces and disposed between adjacent regions, for substantially preventing electrical charge from leaking between said adjacent regions.

3. The piezoelectric transformer as defined in claim 2 in which:
   the electrical guard element is in the form of a continuous band around the piezoelectric body, the continuous band being oriented in a direction transverse to the length of the piezoelectric body.

4. The piezoelectric transformer as defined in claim 1 in which:
   said piezoelectric body comprises a rectangular piezoelectric plate including opposed, parallel ends transverse to the length of the rectangular plate, the rectangular plate having a transverse center line midway between the opposed transverse ends, said three regions being disposed symmetrically about said transverse center line wherein said three regions include a central region positioned symmetrically between a pair of end regions, and the first and second electrodes covering the major surfaces of one of t he pair of end regions having areas equal to each other and to the areas of the first and second electrodes covering the major surfaces of the other of the pair of end regions.

5. The piezoelectric transformer as defined in claim 4 in which:
   said central region comprises an input region and said pair of end regions comprise output regions.

6. The piezoelectric transformer as defined in claim 4 in which:
   said central region comprises an output region and said pair of end regions comprise input regions.

7. The piezoelectric transformer as defined in claim 4 which includes:
   a second piezoelectric body in the form of a rectangular piezoelectric plate and associated electrodes identical geometrically to the first mentioned rectangular piezoelectric plate and associated electrodes, said second rectangular plate being superimposed on the first rectangular plate with the electrodes on one of the major surfaces of the first rectangular piezoelectric plate being bonded to the corresponding electrodes on one of the major surfaces of the second rectangular piezoelectric plate.

8. The piezoelectric transformer as defined in claim 1 which includes:
   at least one output region, said at least one output region and its associated first and second electrodes being further divided into a plurality of subdivided, spaced apart output regions and associated electrodes.

9. The piezoelectric transformer as defined in claim 8 which includes:
   an electrical guard element, in contact with the opposed, parallel major surfaces of the piezoelectric body and disposed in each space between adjacent regions and adjacent subdivided regions, for substantially preventing electrical charge from leaking between said adjacent regions and subregions.

10. The piezoelectric transformer as defined in claim 1 in which:
    the input region electrodes are electrically isolated from the output region electrodes.

11. A piezoelectric transformer comprising:
    a piezoelectric body having a length and first and second opposed, parallel major surfaces, said piezoelectric body being divided into regions spaced apart along the length of the body, said regions comprising alternate input and output regions, the regions comprising an output region disposed between a pair of input regions;

first and second electrodes covering the first and second opposed, parallel major surfaces, respectively, of each of said regions; and an electrical guard element carried by the piezoelectric body in each space separating adjacent input and output regions, for substantially preventing electrical charge from leaking between said adjacent input and output regions.

12. A piezoelectric transformer, as defined in claim 11 in which:

the piezoelectric body has a transverse, central plane perpendicular to the major surfaces of the body, the three regions being symmetrically disposed about said transverse central plane.

13. A piezoelectric transformer comprising:

a piezoelectric body having a length and first and second opposed, parallel major surfaces, said piezoelectric body being divided into regions spaced apart along the length of the body, said regions comprising alternate input and output regions, the regions comprising an input region disposed between a pair of output regions;

first and second electrodes covering the first and second opposed, parallel major surfaces, respectively, of each of said regions; and an electrical guard element carried by the piezoelectric body in each space separating adjacent input and output regions, for substantially preventing electrical charge from leaking between said adjacent input and output regions.

14. A piezoelectric transformer, as defined in claim 13 in which:

the piezoelectric body has a transverse central plane perpendicular to the major surfaces of the body, and the three regions are disposed symmetrically about said transverse central plane along the length of the piezoelectric body.

15. A piezoelectric transformer comprising:

a rectangular piezoelectric plate having first and second opposed, parallel major surfaces; a length; opposed, parallel ends transverse to said length, and a transverse center line midway between the opposed transverse ends, said rectangular piezoelectric plate being divided into three regions spaced apart along the length of the plate, said regions comprising alternate input and output regions, said three regions being disposed symmetrically about said transverse center line wherein said three regions include a central region positioned symmetrically between a pair of end regions, said rectangular piezoelectric plate being uniformly polarized in a direction normal to said major surfaces along the entire length of said plate;

a first planar electrode and a second planar electrode covering the first and second major surfaces, respectively, of each of said three regions, the first and second planar electrodes covering the major surfaces of one of the pair of end regions having areas equal to each other and to the areas of the first and second planar electrodes covering the major surfaces of the other of the pair of end regions, the application to the piezoelectric transformer of an input signal having a rectangular voltage waveform generating an output signal having a pseudo-rectangular voltage waveform comprising at least the fundamental and third harmonic frequencies of the input signal; and an electrical guard element in contact with the rectangular piezoelectric plate in each space between adjacent regions for substantially preventing electrical charge from leaking between said adjacent regions, said electrical guard element being in the form of a transversely oriented, continuous band around the piezoelectric plate.

16. The piezoelectric transformer as defined in claim 15 in which:

the input region electrodes are electrically isolated from the output region electrodes.

17. The piezoelectric transformer as defined in claim 15 in which:

said central region comprises an input region and said pair of end regions comprise output regions.

18. The piezoelectric transformer as defined in claim 15 in which:

said central region comprises an output region and said pair of end regions comprise input regions.

19. The piezoelectric transformer as defined in claim 15 which includes:

at least one output region, said at least one output region and its associated first and second planar electrodes being further divided into a plurality of subdivided, spaced apart output regions and associated planar electrodes.

20. The piezoelectric transformer as defined in claim 19 which includes:

an electrical guard element, in contact with the opposed, parallel major surfaces of the rectangular piezoelectric plate in each space between adjacent regions and adjacent subdivided regions, for substantially preventing electrical charge from leaking between said adjacent regions and subregions.

21. The piezoelectric transformer as defined in claim 15 which includes:

a second rectangular piezoelectric plate and associated planar electrodes identical geometrically to the first mentioned rectangular piezoelectric plate and associated planar electrodes, said second rectangular plate being superimposed on the first rectangular plate with the electrodes on one of the major surfaces of the first rectangular piezoelectric plate being bonded to the corresponding electrodes on one of the major surfaces of the second rectangular piezoelectric plate.

22. A method of operating a piezoelectric transformer, the transformer comprising a substantially rectangular piezoelectric plate having a length, opposed, parallel top and bottom major surfaces and opposed parallel ends, a first pair of opposed input electrodes formed on and sandwiching the major surfaces of the plate adjacent one of the ends thereof, a second pair of opposed input electrodes formed on and sandwiching the major surfaces of the plate adjacent the other end thereof, said electrodes of said input electrode pairs having identical dimensions, the first and second pairs of input electrodes being spaced apart along the length of the piezoelectric plate to define a central region of the piezoelectric plate, a pair of opposed output electrodes formed on and sandwiching the major surfaces of the plate in the central region thereof, said first and second input electrode pairs being spaced apart from said output electrodes and symmetrically disposed relative to said pair of output electrodes along the length of the plate, the method comprising the step of:

applying across said first and second pairs of input electrodes an input voltage having a substantially rectangular voltage waveform to generate across the pair of output electrodes a psuedo-rectangular voltage waveform including at least the fundamental and third harmonic frequencies of the input signal.

23. The method, as defined in claim 22, including the step of drawing off any current leaking between the pairs of input electrodes, on the one hand, and the pair of output electrodes, on the other hand.

24. A method of operating a piezoelectric transformer, the transformer comprising a substantially rectangular piezoelectric plate having a length, opposed, parallel top and bottom major surfaces and opposed parallel ends, a first pair of opposed output electrodes formed on and sandwiching the major surfaces of the plate adjacent one of the ends thereof, a second pair of opposed output electrodes formed on and sandwiching the major surfaces of the plate adjacent the other end thereof, said electrodes of said output electrode pairs having identical dimensions, the first and second pairs of output electrodes being spaced apart along the length of the piezoelectric plate to define a central region of the piezoelectric plate, a pair of opposed input electrodes formed on and sandwiching the major surfaces of the plate in the central region thereof, said first and second output electrode pairs being spaced apart from said input electrodes and symmetrically disposed relative to said pair of input electrodes along the length of the plate, the method comprising the step of:

applying across said pair of input electrodes an input voltage having a substantially rectangular voltage waveform to generate across the pairs of output electrodes a psuedo-rectangular voltage waveform including at least the fundamental and third harmonic frequencies of the input signal.

25. The method, as defined in claim 24, including the step of drawing off any current leaking between the pair of input electrodes, on the one hand, and the pairs of output electrodes, on the other hand.

* * * * *